(12) United States Patent
Noguchi et al.

(10) Patent No.: US 6,855,996 B2
(45) Date of Patent: Feb. 15, 2005

(54) ELECTRONIC DEVICE SUBSTRATE STRUCTURE AND ELECTRONIC DEVICE

(75) Inventors: Takao Noguchi, Tokyo (JP); Hisatoshi Saitou, Tokyo (JP); Hidenori Abe, Tokyo (JP); Yoshinari Yamashita, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/650,764

(22) Filed: Aug. 29, 2003

(65) Prior Publication Data

US 2004/0099918 A1 May 27, 2004

(30) Foreign Application Priority Data

Aug. 30, 2002 (JP) ....................................... 2002-254790

(51) Int. Cl.⁷ ............................ H01L 21/20; H01S 3/19
(52) U.S. Cl. ...................... 257/419; 257/416; 257/420; 148/33; 148/33.4
(58) Field of Search ............................. 257/18, 22, 416, 257/419, 420, 627, 628; 117/952; 148/33, 33.4; 310/313 A, 313 R, 360; 427/100

(56) References Cited

U.S. PATENT DOCUMENTS 6,045,626 A * 4/2000 Yano et al. ................. 148/33.4

FOREIGN PATENT DOCUMENTS

| JP | 8-109099 | 4/1996 |
| JP | 11-260835 | 9/1999 |

OTHER PUBLICATIONS

Hirofumi Fukumoto, et al., "Heteroepitaxial Growth of Yttria–Stablized Zirconia (YSZ) on Silicon", Japanese Journal of Applied Physics, vol. 27, No. 8, Aug., 1988, pp. L1404–L1405.

* cited by examiner

Primary Examiner—Minhloan Tran
Assistant Examiner—Thomas L Dickey
(74) Attorney, Agent, or Firm—Oblon, Spivak, McClelland, Maier & Neustadt, P.C.

(57) ABSTRACT

An electronic device substrate structure including a substrate 2, a metal thin film 4 as a (111)-oriented film of a face-centered cubic structure or as a (0001)-oriented film of a hexagonal closest packed structure formed on the substrate 2, and a wurtzite type thin film 5 as a (0001)-oriented film of a wurtzite crystal structure formed on the metal thin film 4, wherein: each of the two thin films is a polycrystalline film containing at least two kinds of crystal grains different in direction of crystal orientation in the plane; when the metal thin film 4 is a (111)-oriented film, <11-20> axes in the plane of the wurtzite type thin film 5 are parallel to <1-10> axes in the plane of the metal thin film 4; and when the metal thin film 4 is a (0001)-oriented film, <11-20> axes in the plane of the wurtzite type thin film 5 are parallel to <11-20> axes in the plane of the metal thin film 4.

12 Claims, 8 Drawing Sheets

ABSTRACT

ELECTRONIC DEVICE SUBSTRATE STRUCTURE AND ELECTRONIC DEVICE

BACKGROUND OF THE INVENTION

The present invention relates to an electronic device substrate structure and particularly to an electronic device substrate structure which is provided with a thin film having a wurtzite crystal structure and formed on an Si single crystal substrate and which is applied to piezoelectric effect-using devices such as thin-film bulk vibrators, SAW (Surface Acoustic Wave) devices, etc.; semiconductor light-emitting devices such as LEDs (Light-Emitting Diodes), laser diodes, etc.; IC heat sinks; and optical devices such as optical modulators, optical switches, OEICs (Opto-Electronic Integrated Circuits), etc.; and an electronic device using the substrate structure.

An integrated electronic device having functional films of oxide, nitride, etc. formed on an Si substrate as a semiconductor crystal substrate has been invented. For example, an LSI higher in degree of integration or a dielectric isolation LSI by an SOI technique by combination of a semiconductor substrate and a dielectric thin film has been examined. When a thin film of a ferroelectric substance as a kind of dielectric is further used, it is possible to form a non-volatile memory, an infrared sensor, an optical modulator, an optical switch, an OEIC, etc. When a semiconductor substrate and a superconductor thin film are combined, it is possible to form an SQUID, a Josephson device, a superconducting transistor, an electromagnetic wave sensor, a superconducting wiring LSI, etc. When a semiconductor substrate and a piezoelectric thin film are combined, it is possible to form an SAW device, a convolver, a collimator, a memory device, an image scanner, a thin-film bulk vibrator, a filter, etc.

To achieve optimal device characteristic in the electronic devices using these functional films and keep the reproducibility thereof high, it is preferable that the crystallinity of the functional films is made as high as possible. ZnO or AlN widely known as a typical piezoelectric substance exhibits high piezoelectricity in a <0001> direction of crystal, that is, in a direction of a c axis because ZnO or AlN has a wurtzite crystal structure. In the electronic devices using these materials as functional films, it is therefore preferable that the functional films are provided as simple c face-oriented highly crystalline films.

Under such circumstances, the present inventors of the invention have made a proposal in JP-A-11-260835. In the proposal, a buffer layer of $ZrO_2$ or the like is provided as a single crystal film (epitaxial film) on an Si single crystal substrate, a metal thin film of Pt or the like is further provided as a single crystal film on the buffer layer, and a wurtzite type thin film of ZnO, AlN or the like having a wurtzite crystal structure is further formed on the metal thin film so that the wurtzite type thin film is provided as a simple c face-oriented single crystal film.

In a thin-film bulk vibrator using an Si single crystal substrate, the Si single crystal substrate is anisotropically etched with a KOH solution or the like in a production process to thereby form a via-hole. For this reason, it is necessary to use an Si single crystal substrate having an Si(100) plane oriented in parallel to the substrate surface.

SUMMARY OF THE INVENTION

An object of the invention is to provide an electronic device which exhibits excellent characteristic and which has a structure including an Si (100) substrate, a metal thin film used as an electrode, a reflecting layer or the like and formed on the Si(100) substrate, and a simple c face-oriented highly crystalline functional thin film of a wurtzite crystal structure formed on the metal thin film.

The foregoing object is achieved by the invention shown in the following paragraphs (1) to (12).

(1) An electronic device substrate structure including a substrate at least having a surface made of Si(100) single crystal, a metal thin film having a face-centered cubic structure or a hexagonal closest packed structure and formed on the substrate, and a wurtzite type thin film having a wurtzite crystal structure and formed on the metal thin film, wherein: the metal thin film is selected from the group consisting of a (111)-oriented film of a face-centered cubic structure having a (111) plane oriented in parallel to the substrate surface, and a (0001)-oriented film of a hexagonal closest packed structure having a (0001) plane oriented in parallel to the substrate surface; the wurtzite type thin film is a (0001)-oriented film having a (0001) plane oriented in parallel to the substrate surface; each of the metal thin film and the wurtzite type thin film is a polycrystalline film containing at least two kinds of crystal grains different in direction of crystal orientation in the plane; when the metal thin film is a (111)-oriented film, the wurtzite type thin film is epitaxially grown on the metal thin film so that <11-20> axes in the plane of the wurtzite type thin film are parallel to <1-10> axes in the plane of the metal thin film; and when the metal thin film is a (0001)-oriented film, the wurtzite type thin film is epitaxially grown on the metal thin film so that <11-20> axes in the plane of the wurtzite type thin film are parallel to <11-20> axes in the plane of the metal thin film.

(2) An electronic device substrate structure according to the paragraph (1), wherein: the metal thin film contains two kinds of crystal grains different in direction of crystal orientation in the plane; when the metal thin film is a (111)-oriented film, respective <1-10> axes of the two kinds of crystal grains are perpendicular to each other; and when the metal thin film is a (0001)-oriented film, respective <11-20> axes of the two kinds of crystal grains are perpendicular to each other.

(3) An electronic device substrate structure according to the paragraph (2), further including a buffer layer interposed between the substrate and the metal thin film, wherein the buffer layer is epitaxially grown so that a (001) plane of the buffer layer is parallel to the substrate and that a <100> axis in the plane of the buffer layer is parallel to a <010> axis in the Si(100) single crystal plane of the substrate.

(4) An electronic device substrate structure according to the paragraph (3), wherein: when the metal thin film is a (111)-oriented film, a <1-10> axis in one of the two kinds of crystal grains contained in the metal thin film is parallel to the <100> axis in the plane of the buffer layer while a <1-10> axis in the other of the two kinds of crystal grains is parallel to the <010> axis in the plane of the buffer layer; and when the metal thin film is a (0001)-oriented film, a <11-20> axis in one of the two kinds of crystal grains contained in the metal thin film is parallel to the <100> axis in the plane of the buffer layer while a <11-20> axis in the other of the two kinds of crystal grains is parallel to the <010> axis in the plane of the buffer layer.

(5) An electronic device substrate structure according to the paragraph (4), wherein a <11-20> axis in one of the two kinds of crystal grains contained in the wurtzite type thin film is parallel to the <010> axis in the Si(100) single crystal plane of the substrate while a <11-20> axis in the other of the two kinds of crystal grains contained in the wurtzite type thin film is perpendicular to the <010> axis in the Si(100) single crystal plane of the substrate.

(6) An electronic device substrate structure according to any one of the paragraphs (3) through (5), wherein the buffer layer contains zirconium oxide as a main component.

(7) An electronic device substrate structure according to any one of the paragraphs (1) through (6), wherein the metal thin film is larger in mean crystal grain size than the wurtzite type thin film.

(8) An electronic device substrate structure according to any one of the paragraphs (1) through (7), wherein the metal thin film contains, as a main component, at least one member selected from the group consisting of Pt, Au, Ir, Os, Re, Pd, Rh and Ru.

(9) An electronic device substrate structure according to anyone of the paragraphs (1) through (8), wherein the wurtzite type thin film is either an AlGaInN type thin film containing, as main components, N and at least one member selected from the group consisting of Al, Ga and In, or a ZnO type thin film containing zinc oxide as a main component.

(10) An electronic device substrate structure according to any one of the paragraphs (1) through (9), wherein the metal thin film is provided so that a half-value width of a rocking curve of reflection in a (111) or (0002) plane in x-ray diffraction is not larger than 3°.

(11) An electronic device including an electronic device substrate structure defined in any one of the paragraphs (1) through (10), and a second metal thin film formed on the wurtzite type thin film of the substrate structure, wherein the pair of metal thin films between which the wurtzite type thin film is sandwiched serve as electrodes.

(12) An electronic device according to the paragraph (11), wherein the wurtzite type thin film has piezoelectric characteristic so that the electronic device serves as a thin-film bulk vibrator.

DETAILED DESCRIPTION OF THE PREFERRED EMBODIMENTS

Figure 1:
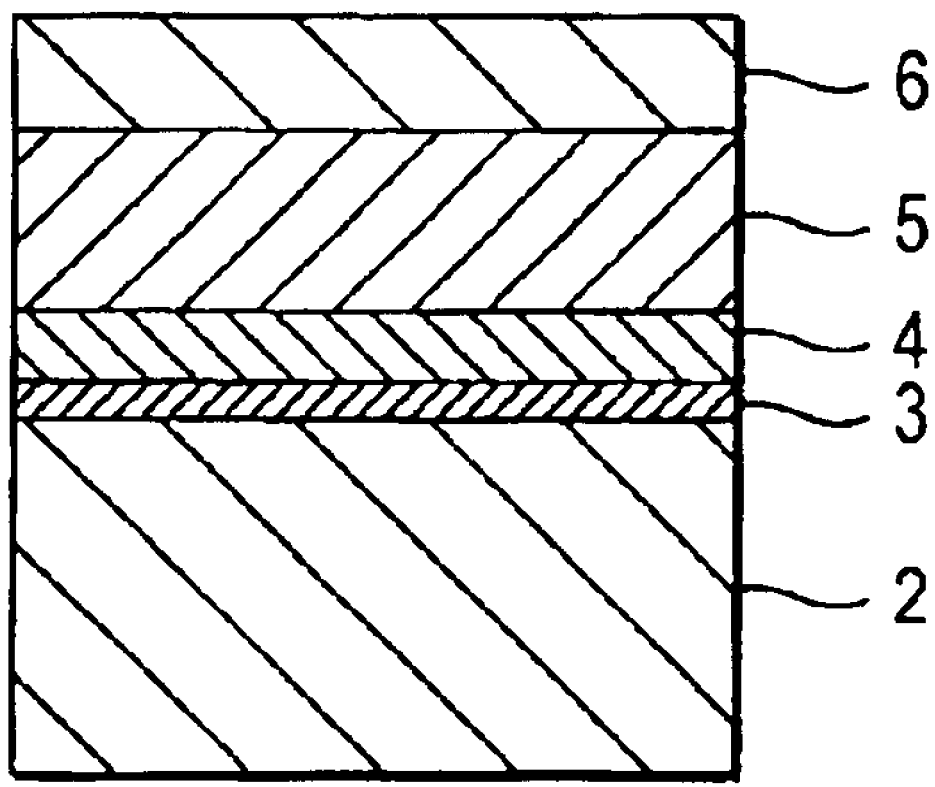
FIG. 1 is a sectional view showing an example of the configuration of an electronic device according to the invention.

FIG. 1 typically shows an example of the configuration of an electronic device according to the invention. The electronic device shown in FIG. 1 includes an electronic device substrate structure, and a second metal thin film 6. The electronic device substrate structure includes a substrate 2, a buffer layer 3 formed on the substrate 2, a metal thin film 4 formed on the buffer layer 3, and a wurtzite type thin film 5 formed on the metal thin film 4. The second metal thin film 6 is formed on the wurtzite type thin film 5 of the electronic device substrate structure. The metal thin film 4 and the second metal thin film 6 between which the wurtzite type thin film 5 is sandwiched serve as electrodes. The substrate 2 is made of Si(100) single crystal as a whole or has a surface made of Si(100) single crystal.

Metal Thin Film 4 and Wurtzite Type Thin Film 5

The metal thin film 4 is made of crystal having a face-centered cubic structure or of crystal having a hexagonal closest packed structure. The wurtzite type thin film 5 is made of crystal having a wurtzite crystal structure.

When the metal thin film 4 has a face-centered cubic structure, the metal thin film 4 is a (111)-oriented film having a (111) plane oriented in parallel to the surface of the substrate 2. When the metal thin film 4 has a hexagonal closest packed structure, the metal thin film 4 is a (0001)-oriented film having a (0001) plane oriented in parallel to the surface of the substrate 2. The wurtzite type thin film 5 is a (0001)-oriented film having a wurtzite crystal (0001) plane oriented in parallel to the surface of the substrate 2.

In the invention, each of the metal thin film 4 and the wurtzite type thin film 5 is a polycrystalline film containing at least two kinds of crystal grains different in direction of crystal orientation in the plane. That is, each of the two thin films is not a single crystal film but a simple oriented film such as a (111)-oriented film or a (0001)-oriented film.

The term "simple oriented film" used in this specification means a film in which the peak intensity of reflection in planes other than a target plane is not higher than 10%, preferably not higher than 5% of the maximum peak intensity of reflection in the target plane when the film is measured by X-ray diffraction. For example, the simple (0001)-oriented film, that is, the simple c face-oriented film is a film in which the peak intensity of reflection in planes other than a (000L) plane is not higher than 10%, preferably not higher than 5% of the maximum peak intensity of reflection in the (000L) plane when the film is measured by 2θ-θ X-ray diffraction. Incidentally, "(000L)" used in this specification is a generic term for equivalent planes such as (0001), (0002), etc. For example, the simple (111)-oriented film is a film in which the peak intensity of reflection in planes other than an (LLL) plane is not higher than 10%, preferably not higher than 5% of the maximum peak intensity of reflection in the (LLL) plane. Incidentally, "(LLL)" is a generic term for equivalent planes such as (111), (222), etc.

Directions of crystal orientation express directions of crystal lattices. In the case of single crystal, directions of all crystal lattices are the same. On the other hand, in the case of non-oriented polycrystal, directions of all crystal lattices in one crystal grain are generally the same (i.e., crystal orientation has one direction) but the direction of crystal orientation in one crystal grain is different from those in other crystal grains. That is, the direction of crystal orientation varies at random according to the crystal grains. In the invention, the direction of crystal orientation in each of the metal thin film 4 and the wurtzite type thin film 5 may vary at random according to the crystal grains in the same manner as the general polycrystal or each of the metal thin film 4 and the wurtzite type thin film 5 may contain a plurality of crystal grains having the same direction of crystal orientation. In the invention, the phrase "the thin film contains at least two kinds of crystal grains different in direction of crystal orientation" means that the thin film contains at least two kinds of crystal grains on the assumption that crystal grains having the same direction of crystal orientation are collectively counted as one kind.

When the metal thin film 4 is a (111)-oriented film, the wurtzite type thin film 5 is epitaxially grown on the metal thin film 4 so that <11-20> axes in the plane of the wurtzite type thin film 5 are parallel to <1-10> axes in the plane of the metal thin film 4. On the other hand, when the metal thin film 4 is a (0001)-oriented film, the wurtzite type thin film 5 is epitaxially grown on the metal thin film 4 so that <11-20> axes in the plane of the wurtzite type thin film 5 are parallel to <11-20> axes in the plane of the metal thin film 4. That is, when attention is paid to a specific crystal grain in the (111)-oriented metal thin film 4, the <1-10> axis of the specific crystal grain is parallel to the <11-20> axis of a crystal grain of the wurtzite type thin film 5 grown on the specific crystal grain. On the other hand, when attention is paid to a specific crystal grain in the (0001)-oriented metal thin film 4, the <11-20> axis of the specific crystal grain is parallel to the <11-20> axis of a crystal grain of the wurtzite type thin film 5 grown on the specific crystal grain.

Incidentally, when, for example, a crystal axis is expressed as <11-20> in this specification, "-2" means overscored 2(i.e. "$\bar{2}$"). What is meant by the minus sign "−" in other crystal axes and crystal faces is the same as described above.

When the mean crystal grain size of the metal thin film 4 is expressed as $d_M$ and the mean crystal grain size of the wurtzite type thin film 5 is expressed as $d_W$, $d_M$ and $d_W$ are selected to have the following relation:

preferably, $1 < d_M/d_W$ more preferably, $5 \leq d_M/d_W$ further more preferably, $10 \leq d_M/d_W$ When a production method which will be described later is used, it is difficult to change $d_W$ widely. Generally, $d_W$ is selected to be in a range of from 1 nm to 100 nm, especially in a range of from 5 nm to 50 nm. On the other hand, it has been found that $d_M$ can be changed relatively easily when the production condition is controlled. When $d_M$ is selected to be larger than $d_W$, a plurality of crystal grains of the wurtzite type thin film 5 are present on a large crystal grain of the metal thin film 4. Because the plurality of crystal grains are all epitaxially grown on the large crystal grain of the metal thin film 4, the directions of orientation of crystal axes of the plurality of crystal grains in the plane of the film are the same. That is, the plurality of crystal grains can be regarded as one crystal (single crystal) as a whole. Accordingly, the crystallinity of the wurtzite type thin film 5 is so excellent that excellent characteristic of an electronic device can be obtained.

It is however difficult to make $d_M$ remarkably large. Generally, $d_M$ is selected to be in the following range that can be achieved reproducibly.

$d_M/d_W \leq 1000$, especially, $d_M/d_W \leq 50$

Incidentally, in the plurality of crystal grains in the wurtzite type thin film 5, boundaries between adjacent crystal grains are clear though directions of orientation of crystal axes in the plane of the film are the same. The boundaries can be confirmed by a transmission electron microscope (TEM). In a secondary electron image of a scanning electron microscope (SEM), convex crystal grains are arranged so that crystal grain boundaries are depressed like grooves.

In this specification, the mean crystal grain size is calculated as follows. First, in a TEM image, the area of a view field is divided by the number of crystal grains contained in the view field to thereby calculate an average area per crystal grain. Then, while a circle having the average area is assumed, the diameter of the circle is calculated as a mean crystal grain size.

As described above, directions of crystal orientation in the plane of the metal thin film 4 may be random. In this invention, an appropriate buffer layer 3 may be provided so that the metal thin film 4 having only two kinds of crystal grains different in direction of crystal orientation in the plane can be formed reproducibly as will be described below.

Figure 2:
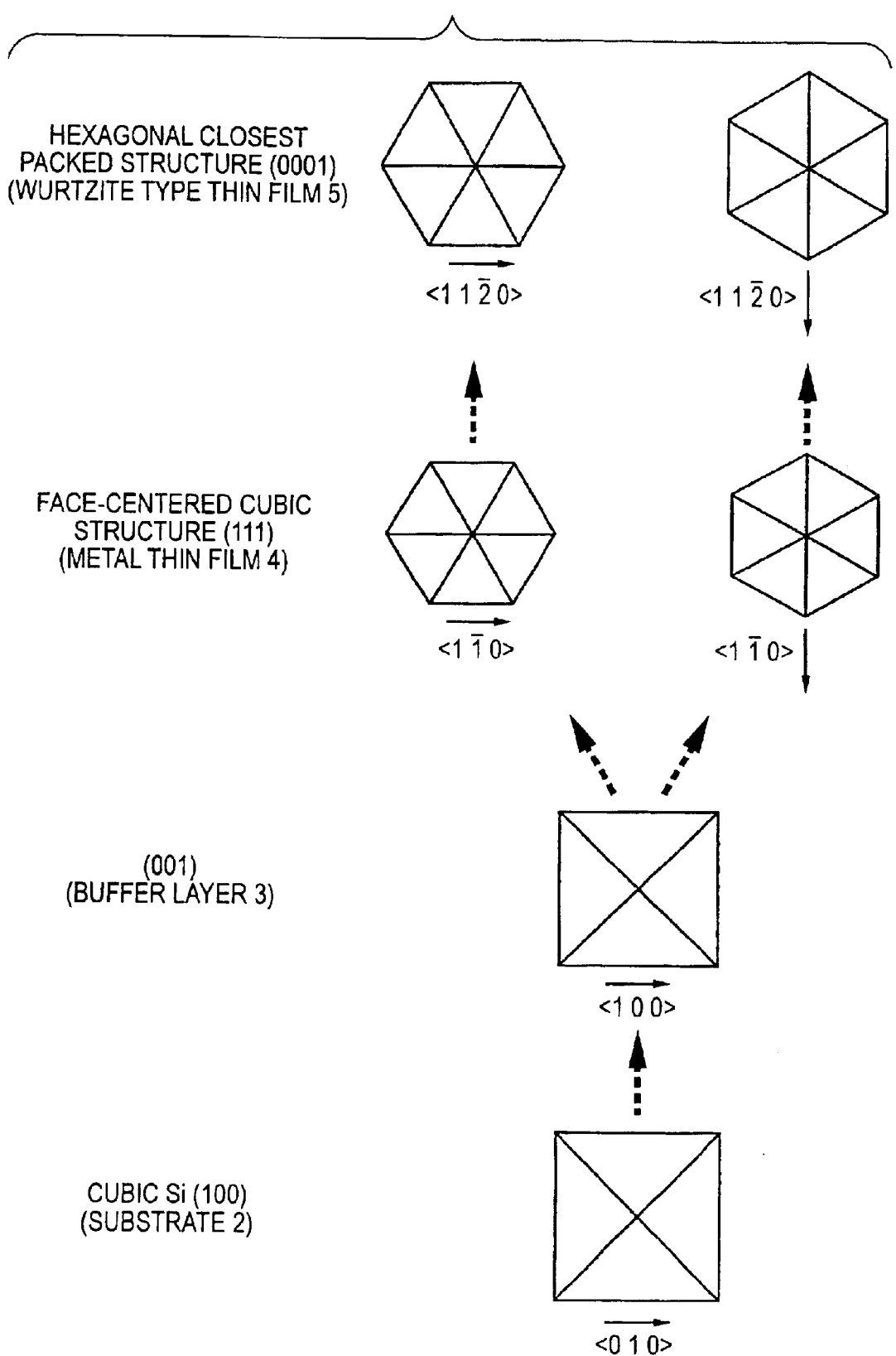
FIG. 2 is a typical view showing directions of crystal orientation in planes of a substrate and respective thin films formed on the substrate in an electronic device substrate structure according to the invention.
Figure 3:
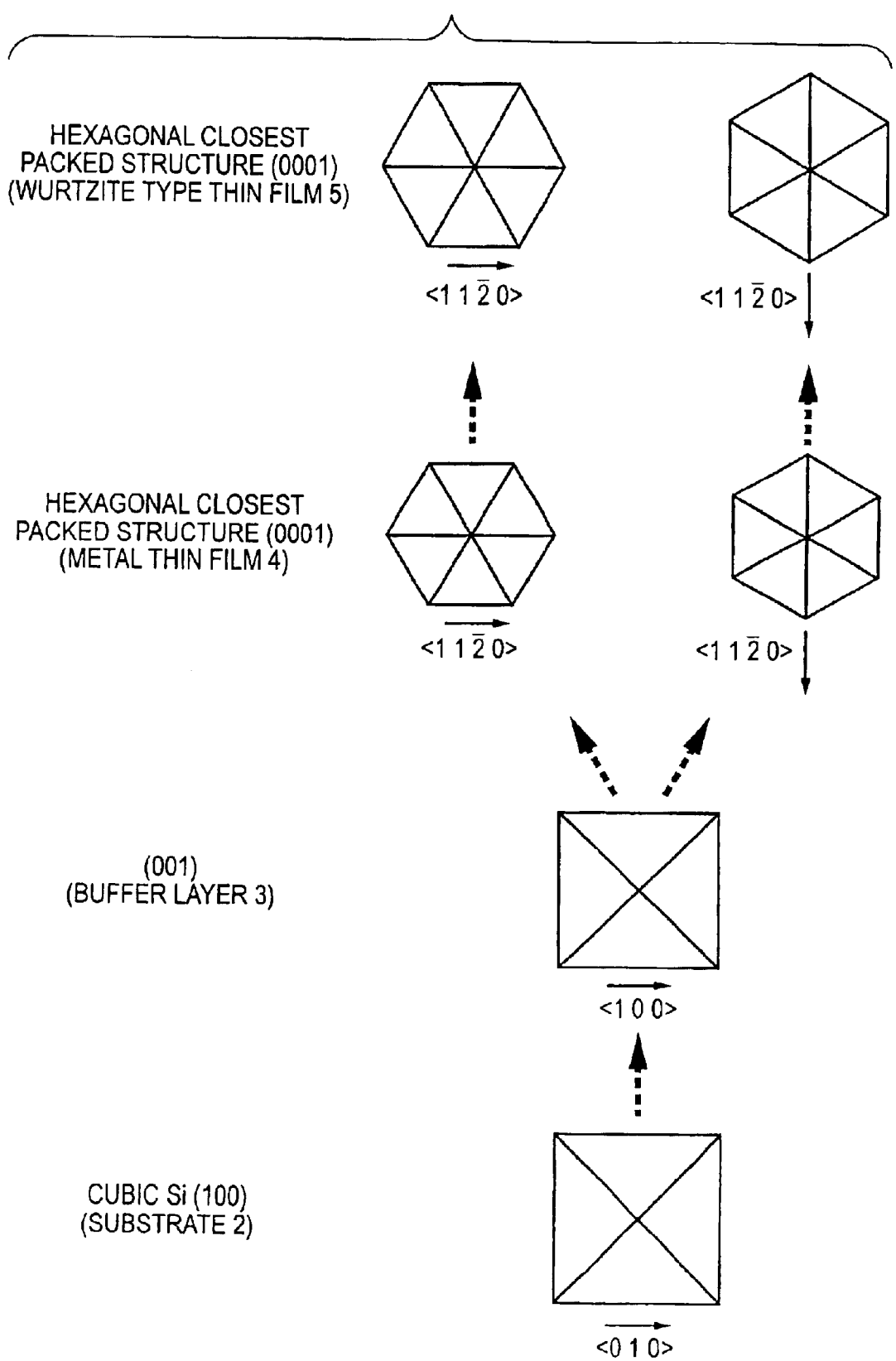
FIG. 3 is a typical view showing directions of crystal orientation in planes of a substrate and respective thin films formed on the substrate in an electronic device substrate structure according to the invention.

FIGS. 2 and 3 show orientation of crystal axes in the plane in each of the substrate 2, the buffer layer 3, the metal thin film 4 and the wurtzite type thin film 5 by using polygons constituted by surface atoms. In FIG. 2, the metal thin film 4 is made of crystal having a face-centered cubic structure. In FIG. 3, the metal thin film 4 is made of crystal having a hexagonal closest packed structure.

Because the lattice constant difference between the (100) plane of the substrate 2 and the (001) plane of the buffer layer 3 is small, that is, because lattice mismatch described in JP-A-11-260835 is small, the buffer layer 3 is epitaxially grown so that the square in the (001) plane of the buffer layer 3 is piled up on the square in the Si(100) plane of the substrate 2.

In FIG. 2, because the lattice constant difference between the (001) plane of the buffer layer 3 and the (111) plane of the metal thin film 4 is small, the metal thin film 4 is epitaxially grown so that each hexagon in the (111) plane of the metal thin film 4 is piled up on the square in the (001) plane of the buffer layer 3. Incidentally, because one side of each hexagon in the (111) plane highly matches either of two orthogonal sides of the square in the (001) plane, hexagons in the (111) plane are provided in two kinds of directions as shown in FIG. 2. That is, the metal thin film 4 is made of two kinds of crystal grains having <1-10> axes perpendicular to each other.

FIG. 3 is the same as FIG. 2 except that each hexagon in the metal thin film 4 is in the (0001) plane. Hexagons in the (0001) plane are provided in two kinds of directions in the same manner as in FIG. 2. In this case, the metal thin film 4 is made of two kinds of crystal grains having <11-20> axes perpendicular to each other.

The ratio of the number of crystal grains contained in one kind to the total number of crystal grains contained in the two kinds of crystal grains shown in each of FIGS. 2 and 3 is not particularly limited but generally selected to be in a range of from 0.1 to 0.9.

The wurtzite type thin film 5 is epitaxially grown so that hexagons in the (0001) plane of the wurtzite type thin film 5 are piled up on the hexagons in the (111) plane of the metal thin film 4. Accordingly, in FIG. 2, the wurtzite type thin film 5 is epitaxially grown on the metal thin film 4 so that <11-20> axes in the plane of the wurtzite type thin film 5 are parallel to <1-10> axes in the plane of the metal thin film 4. In FIG. 3, the wurtzite type thin film 5 is epitaxially grown on the metal thin film 4 so that <11-20> axes in the plane of the wurtzite type thin film 5 are parallel to <11-20> axes in the plane of the metal thin film 4.

In each of FIGS. 2 and 3, the <11-20> axis of one of the two kinds of crystal grains contained in the wurtzite type thin film 5 is parallel to the <010> axis in the Si(100) single crystal plane of the substrate 2 whereas the <11-20> axis of the other of the two kinds of crystal grains contained in the wurtzite type thin film 5 is perpendicular to the <010> axis in the Si(100) single crystal plane of the substrate 2.

Incidentally, in actual films, distortion may occur in crystal lattices. For this reason, crystal axes expressed as being perpendicular or parallel to each other in this specification may not be perpendicular or parallel to each other strictly. The concept "perpendicular" or "parallel" used in this invention, however, allows minute displacement from "perpendicular" or "parallel", as caused by lattice distortion or the like.

In the electronic device substrate structure according to the invention, the metal thin film mainly functions as an electrode. In an electronic component such as an optical modulator, a thin-film bulk vibrator, etc. using a thin film of a wurtzite type compound such as ZnO or AlN as a functional film, an electric field is applied in the direction of the thickness of the functional film to there by effectuate functions of the electronic component. In such a purpose of use, it is necessary to provide an electrode under the functional film. In a light-emitting device such as an LED or a laser diode, it is important to make luminance high. Although increase in luminance can be achieved by increase in quality of a semiconductor thin film, increase in luminance may be achieved easily when a function for reflecting emitted light is provided in the device. For example, a thin film which serves as a reflecting layer may be disposed in an appropriate position in the device so that emission of emitted light to the outside of the device can be promoted. The metal thin film according to the invention can function as such a reflecting layer. Furthermore, because the metal thin film performs a role of absorbing stress in the thin film laminate, the metal thin film is effective in preventing a thin film formed on the metal thin film from cracking.

In addition, when the lattice constant of the metal thin film is preferably made to match the lattice constant of a thin film to be formed on the metal thin film, the metal thin film performs a role of forming the thin film as a highly crystalline thin film. It is therefore preferable that the metal thin film is excellent in crystallinity and surface flatness.

For production of an excellent-characteristic electronic device substrate structure, it is preferable that each of the metal thin film 4 and the wurtzite type thin film 5 is excellent in crystallinity and surface flatness. Specifically, the metal thin film 4 preferably has such crystallinity that a half-value width of a rocking curve of reflection in a (111) plane of the face-centered cubic structure or in a (0002) plane of the hexagonal closest packed structure in X-ray diffraction is not larger than about 3° whereas the wurtzite type thin film 5 preferably has such crystallinity that a half-value width of a rocking curve of reflection in a (0002) plane in X-ray diffraction is not larger than about 3°.

The lower limit of the half-value width of the rocking curve in each of the metal thin film 4 and the wurtzite type thin film 5 need not be set particularly. Although it is preferable that the lower limit is as small as possible, the lower limit of the half-value width of the rocking curve is generally about 0.5° at present.

Incidentally, surfaces of the thin films may be polished so as to be improved in flatness. As the polishing, there may be used chemical polishing using an alkaline solution or the like, mechanical polishing using colloidal silica or the like, or combination of chemical polishing and mechanical polishing.

Preferably, the metal thin film 4 contains, as a main component, at least one member selected from the group consisting of Pt, Au, Ir, Os, Re, Pd, Rh and Ru. Preferably, the metal thin film 4 is made of a single metal selected from the group or of an alloy containing metals selected from the group. Incidentally, Pt, Au, Ir, Pd and Rh form a face-centered cubic structure whereas Os, Re and Ru form a hexagonal closest packed structure.

The thickness of the metal thin film varies according to the purpose of use. The thickness of the metal thin film is selected to be preferably in a range of from 5 nm to 500 nm, more preferably in a range of from 50 nm to 250 nm. The thickness of the metal thin film is preferably reduced to such a degree that both crystallinity and surface flatness are not spoiled. More specifically, in order to make the metal thin film function as a reflecting mirror sufficiently, the thickness of the metal thin film is preferably selected to be not smaller than 30 nm. When thickness is not larger than 100 nm, a sufficient reflecting ability can be obtained. In order to make the metal thin film function as an electrode sufficiently, the thickness of the metal thin film is preferably selected to be in a range of from 50 nm to 500 nm.

The composition of the wurtzite type thin film 5 is not particularly limited but may be decided suitably so that characteristic required of the electronic device substrate structure as a target can be obtained. For example, because lattice constants and thermal expansion coefficients can be adjusted by the composition, the composition may be selected in accordance with the lattice constant and thermal expansion coefficient of a thin film to be formed on the electronic device substrate structure. Preferably, the wurtzite type thin film 5 is constituted by an AlGaInN type thin film or a ZnO type thin film as will be described below.

The AlGaInN type thin film contains, as main components, N and at least one member selected from the group consisting of Al, Ga and In. The composition of the AlGaInN type thin film is not particularly limited but the AlGaInN type thin film preferably has a composition substantially represented by $Ga_x In_y Al_{1-x-y} N$ ($0 \leq x \leq 1$, $0 \leq x+$ $y \leq 1$). The AlGaInN type thin film may be an n-type or p-type semiconductor film. When the AlGaInN type thin film is provided as a semiconductor film, the AlGaInN type thin film can be used as part of a nitride semiconductor device. When, for example, a known doping element such as Si or Mg is added into $Ga_xIn_yAl_{1-x-y}N$ formed as a semiconductor, the AlGaInN type thin film can be provided as a semiconductor film. The AlGaInN type thin film may be formed as a multi-layer film so that the AlGaInN type thin film has p-n junctions or double hetero junctions. The ZnO type thin film contains zinc oxide as a main component. Preferably, the ZnO type thin film is substantially made of ZnO. When Li is added into the ZnO type thin film, resistance increases or ferroelectricity appears. Therefore, Li or Li oxide may be added into the ZnO type thin film as occasion demands.

The thickness of the wurtzite type thin film 5 is selected to be preferably in a range of from 5 nm to 50 μm, more preferably in a range of from 0.1 μm to 10 μm. If the wurtzite type thin film 5 is too thin, an excellent-characteristic electronic device substrate structure cannot be obtained according to the purpose of use. On the other hand, if the wurtzite type thin film 5 is too thick, production efficiency is lowered. Incidentally, when the electronic device substrate structure according to the invention is used as a substrate for an SAW device, the thickness of the wurtzite type thin film 5 is preferably selected to be not smaller than about 3 μm so that surface acoustic wave propagated through the wurtzite type thin film 5 is not affected by the Si substrate slow in propagation velocity.

The wurtzite type thin film 5 may be a laminate of two or more kinds of thin films different in composition or may be a gradient structure film having a composition changing gradually in the direction of the thickness of the film.

Buffer Layer 3

The composition and crystallinity of the buffer layer 3 are selected suitably in accordance with the metal thin film 4 to be formed on the buffer layer 3.

When the metal thin film 4 is to be formed as a polycrystalline film in which directions of crystal orientation in the plane are random, the buffer layer 3 may be made of silicon oxide such as $SiO_2$, silicon nitride such as $Si_3N_4$, aluminum oxide such as $Al_2O_3$, or aluminum nitride such as AlN. As the material for forming the buffer layer 3, there may be used oxide, nitride or oxynitride containing two or more kinds of compounds selected from these oxides and nitrides. Especially, aluminum nitride is preferably crystalline and other compounds are preferably amorphous.

When the metal thin film 4 is formed to contain two kinds of crystal grains different in direction of crystal orientation in the plane as shown in each of FIGS. 2 and 3, a buffer layer 3 containing zirconium oxide as a main component is preferably provided.

Although the buffer layer 3 containing zirconium oxide as a main component is most preferably made of only zirconium oxide such as $ZrO_2$, the buffer layer 3 may be made of stabilized zirconia containing rare-earth element oxide. In this specification, "rare-earth element" is an element selected from the group consisting of lanthanoides, Sc and Y.

As the rare-earth element oxide, at least one member is preferably selected from the group consisting of $Yb_2O_3$, $Tm_2O_3$, $Er_2O_3$, $Y_2O_3$, $Ho_2O_3$, $Gd_2O_3$, $Dy_2O_3$, $Tb_2O_3$, $Pr_2O_3$, $Nd_2O_3$, $CeO_2$, $Eu_2O_3$, $Sm_2O_3$, $La_2O_3$, $Sc_2O_3$, and $Lu_2O_3$. In consideration of lattice constant matching with a thin film to be formed on the buffer layer, at least one member is more preferably selected from the group consisting of $Yb_2O_3$, $Sc_2O_3$, and $Lu_2O_3$. When two or more kinds of rare-earth elements are contained, the ratio thereof is optional.

Although the buffer layer 3 containing zirconium oxide as a main component is preferably made of oxide having a stoichiometric composition, the oxide may be deviated from such a stoichiometric composition.

$ZrO_2$ produces phase transition of cubic structure→tetragonal structure→monoclinic structure when the temperature changes from a high temperature to the room temperature. The material obtained by adding a rare-earth element to $ZrO_2$ to stabilize the cubic structure is stabilized zirconia. The crystallinity of $Zr_{1-x}R_xO_{2-2x}$ films depends on the range of x. As reported in Jpn. J. Appl. Phys., 27 (8)L1404-L1405, (1988), tetragonal or monoclinic crystal is produced in the composition range in which x is smaller than 0.2.

To form the metal thin film 4 having directions of crystal orientation shown in each of FIGS. 2 and 3, it is preferable that the buffer layer 3 containing zirconium oxide as a main component is formed as a (001)-oriented film having a monoclinic or tetragonal structure and having a (001) plane oriented in parallel to the substrate 2. It is especially preferable that the buffer layer 3 is formed as a monoclinic (001)-oriented film.

In the buffer layer 3 containing zirconium oxide as a main component, insulation resistance increases to reduce a leakage current as the purity of zirconium oxide increases. When insulating characteristic is required, it is therefore preferable that the purity of zirconium oxide is high. The percentage of Zr in constituent elements except oxygen in the thin film is selected to be preferably higher than 93% by mole, more preferably not lower than 95% by mole, further preferably not lower than 98% by mole, most preferably not lower than 99.5% by mole. In the high-purity zirconium oxide thin film, constituent elements except oxygen and Zr are generally rare-earth elements, P, etc. Incidentally, the upper limit of the percentage of Zr is about 99.99% by mole at present. Because $ZrO_2$ and $HfO_2$ can hardly be separated from each other by the present highly purifying technique, the purity of $ZrO_2$ inclusive of $HfO_2$ is generally regarded as the purity of $ZrO_2$. Accordingly, the purity of $ZrO_2$ in this specification is a value calculated on the assumption that Hf and Zr are regarded as one element. There is however no problem because $HfO_2$ has the same function as $ZrO_2$ in the buffer layer 3 in this invention.

An additive for improving characteristic may be introduced into the buffer layer 3 containing zirconium oxide as a main component. When, for example, the buffer layer 3 is doped with an alkaline earth element such as Ca or Mg, pinholes of the film can be reduced to suppress the leakage current. Further, an element such as Al or Si is effective in improving the resistivity of the film. Further, a transition element such as Mn, Fe, Co or Ni can form an impurity level (trap level) in the film and can control electrically conducting characteristic by using this level.

The thickness of the buffer layer 3 containing zirconium oxide as a main component is selected to be preferably in a range of from 5 nm to 500 nm, more preferably in a range of from 10 nm to 50 nm. If the buffer layer 3 is too thin or too thick, it is difficult to satisfy crystallinity, surface flatness and insulation characteristic simultaneously. On the other hand, the thickness of the other type buffer layer, that is, the buffer layer made of silicon oxide or the like is also preferably selected to be in the same range as the thickness of the buffer layer containing zirconium oxide as a main component, in consideration of surface flatness and insulation characteristic.

Incidentally, the buffer layer may be a laminate formed in such a manner that two or more kinds of thin films different in composition are laminated as two or more layers. Or the buffer layer may be a gradient structure film having a composition changing gradually in the direction of the thickness of the film. Examples of the laminated buffer layer include: alaminate formed in such a manner that thin films of silicon oxide and aluminum nitride are laminated alternately as two layers or as three or more layers; and a laminate formed in such a manner that thin films of silicon nitride and aluminum nitride are laminated alternately as two layers or as three or more layers. The sequence of lamination of respective thin films in each laminated buffer layer is not particularly limited. When the laminated buffer layer is applied to a thin-film vibrator, the buffer layer can function as an acoustic reflection film. In this case, the thickness of each of constituent thin films of the buffer layer is preferably selected to be about ¼ as large as the wavelength of acoustic wave to be reflected.

Substrate 2

A surface of the substrate 2 is constituted by a (100) plane of Si single crystal. The whole of the substrate 2 may be made of Si(100) single crystal or only the surface of the substrate 2 may be made of Si(100) single crystal. Various kinds of thin films formed on the substrate 2 may crack according to the condition. The thickness of the substrate 2 maybe selected to be preferably in a range of from about 10 $\mu$m to about 100 $\mu$m, more preferably in a range of from about 25 $\mu$m to about 75 $\mu$m so that various kinds of thin films can be prevented from cracking.

The Si single crystal substrate used in this invention is more inexpensive than a sapphire substrate and an SiC single crystal substrate. Accordingly, an inexpensive electronic device substrate structure can be provided.

Electronic Device

The electronic device substrate structure according to the invention may be used as it is or may be used in combination with a second metal thin film 6 provided on the wurtzite type thin film 5. As described above, the electronic device substrate structure can be applied to various devices such as a non-volatile memory, an infrared sensor, an optical modulator, an optical switch, an OEIC, an SQUID, a Josephson device, a superconducting transistor, an electromagnetic wave sensor, a superconducting wiring LSI, an SAW device, a convolver, a collimator, a memory device, an image scanner, a thin-film bulk vibrator, various kinds of filters, etc., as well as an LED and a laser diode.

Thin-Film Bulk Vibrator

Figure 5:
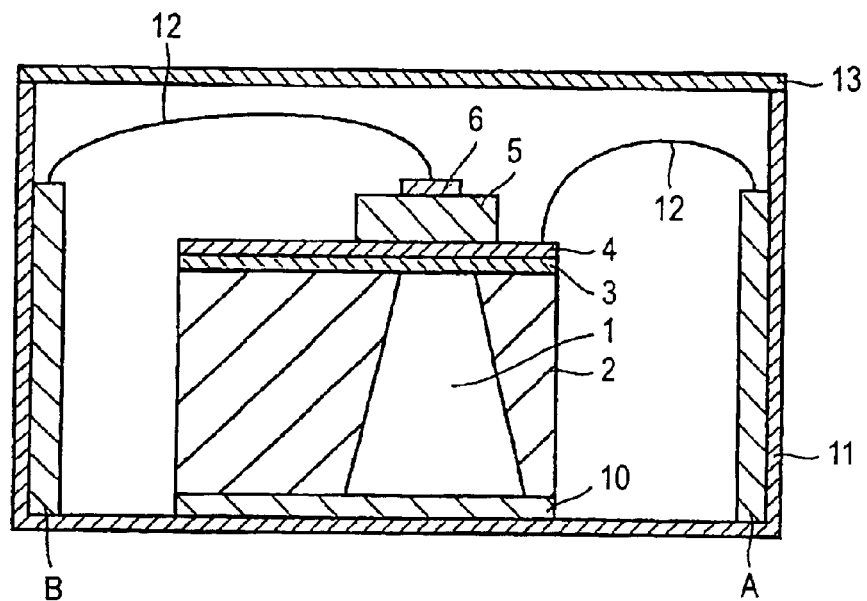
FIG. 5 is a sectional view showing an example of the configuration of a thin-film bulk vibrator.

FIG. 5 shows an example of the configuration of a thin-film bulk vibrator which is an example of an electronic device having a functional film such as a piezoelectric film provided on an Si substrate.

The thin-film bulk vibrator shown in FIG. 5 includes: a substrate 2 made of Si(100) single crystal and having a via-hole 1 formed therein; a buffer layer 3 formed on the substrate 2; a metal thin film (lower electrode) 4 formed on the buffer layer 3; a wurtzite type thin film (piezoelectric film) 5 formed on the metal thin film 4; and a second metal thin film (upper electrode) 6 formed on the wurtzite type thin film 5. The via-hole 1 is formed by anisotropic etching of Si(100) single crystal from the bottom side in FIG. 5. The via-hole 1 and thin films laminated above the via-hole 1 form a diaphragm. The lower surface of the substrate 2 is bonded to a bottom surface of a package 11 by a die-bonding agent 10. A top portion of the package 11 is sealed with a cover 13. Incidentally, this structure is produced as follows. Respective thin films are formed on the substrate. After the substrate is etched, the substrate with the respective thin films is divided in to chips by a dicing device. One of the chips is bonded to the package to thereby produce this structure. External connection terminals A and B communicating with the outside are disposed in the package 11. The external connection terminals A and B are electrically connected to the metal thin film 4 and the second metal thin film 6 through wires 12 respectively.

Because it is necessary to form the via-hole 1 by anisotropic etching of Si single crystal, the substrate 2 is made of Si(100) single crystal having a cubic (100) plane oriented in parallel to the substrate surface.

Nitride Semiconductor Device

When the wurtzite type thin film 5 in the invention is made of wurtzite type nitride provided as a semiconductor, a semiconductor substrate having a nitride semiconductor thin film can be provided.

When the electronic device substrate structure according to the invention is applied to a nitride semiconductor device, configuration may be preferably made so that the wurtzite type thin film made of nitride is processed into a semiconductor film. As occasion demands, configuration may be made so that a nitride semiconductor layer is formed on the wurtzite type thin film. Then, an electrode or the like is added to the electronic device substrate structure to thereby form a nitride semiconductor device.

The reason why a nitride semiconductor layer is further formed on the wurtzite type thin film made of nitride is as follows. If the substrate temperature is high at the time of forming the wurtzite type thin film of nitride, it is relatively difficult to form a growth nucleus homogeneously so that it is difficult to obtain good surface flatness. On the other hand, if the substrate temperature is low, it is relatively difficult to obtain good crystallinity though a growth nucleus can be formed homogeneously. Accordingly, when it is difficult to have good surface flatness and high crystallinity simultaneously in the wurtzite type thin film constituted by a single nitride thin film, the wurtzite type thin film of nitride may be formed as an undercoat at a relatively low temperature before a nitride semiconductor layer is formed on the undercoat at a relatively high temperature. In this case, the wurtzite type thin film and the nitride semiconductor layer may be different in composition or may be the same in composition.

The nitride semiconductor layer can be formed in the same manner as the AlGaInN type thin film provided as a semiconductor film. The thickness of the nitride semiconductor layer varies according to its function but is generally preferably selected to be in a range of from about 2 nm to about 5 $\mu$m.

The purpose of use of the nitride semiconductor device using the electronic device substrate structure according to the invention is not particularly limited. The nitride semiconductor device can be preferably used for various purposes of use of using high crystallinity and flatness of the nitride semiconductor layer. Specifically, for example, a Schottky electrode may be formed on a nitride semiconductor layer to produce a Schottky diode. A plurality of nitride semiconductor layers may be provided to format least one p-n junction to thereby produce a diode, a transistor, a solar cell or the like. An active layer may be further provided to produce a light-emitting diode. A resonance structure may be formed to produce a laser diode.

Production Method

In production of the electronic device substrate structure according to the invention, a method for forming each thin film is not particularly limited. Preferably, a vapor deposition method according to the method described in JP-A-8-109099 is used for forming the buffer layer and the metal thin film. Preferably, a sputtering method, an MOVPE (Metal Organic Vapor Phase Epitaxy) method or an MBE (Molecular Beam Epitaxy) method is used for forming the wurtzite type thin film. Especially preferably, a sputtering method is used for forming the wurtzite type thin film. In the MOVPE method, it is necessary to raise the substrate temperature to about 1000° C. According to the inventors' experiment, it has been however found that the wurtzite type thin film of high crystallinity can be formed by the sputtering method without necessity of heating the substrate from the outside. Incidentally, the substrate may be preferably heated to a temperature of not lower than 200° C. in order to make the crystallinity higher. The upper limit of the temperature for heating the substrate is not particularly provided. The temperature for heating the substrate need not be higher than 800° C. because it is difficult to heat the substrate to a temperature higher than 800° C. when an electric heater which is an ordinary heating unit is used and because the crystallinity of the wurtzite type thin film is not remarkably improved even in the case where the substrate is heated to a temperature higher than 800° C. The sputtering method is different from the MOVPE method in that it is easy to reduce internal stress imposed on the thin film because the internal stress can be controlled freely on the basis of various kinds of conditions such as gas pressure, substrate-target distance, input power, etc.

In the invention, the metal thin film 4 is preferably formed under the following condition in order to increase the mean crystal grain size $d_M$ of the metal thin film 4 to thereby increase the ratio $d_M/d_W$ and in order to form two kinds of crystal grains different in direction of crystal orientation in the plane as shown in FIGS. 2 and 3.

As this condition, first, oxygen plasma is introduced into a vacuum chamber at an initial formation stage when the metal thin film 4 is formed by a vapor deposition method. For example, while oxygen gas is introduced into the vacuum chamber, a high-frequency electric field can be applied to the inside of the vacuum chamber to thereby perform introduction of oxygen plasma. The period of introduction of oxygen plasma is preferably set as a period from a point of time when the formation of the metal thin film 4 starts (i.e., the thickness of the metal thin film 4 is zero) to a point of time when the thickness of the metal thin film 4 reaches a range of from 1 nm to 50 nm, especially a range of from 5 nm to 20 nm. Incidentally, the oxygen plasma introduction period is preferably controlled so that the thickness of the metal thin film 4 at a point of time when introduction of oxygen plasma is completed is not larger than 50%, especially 20% of the final thickness of the metal thin film 4 because there is the possibility that the amount of oxygen mixed with the metal thin film 4 will be too large undesirably when the thickness (final thickness) of the metal thin film 4 is too thin though the oxygen plasma introduction period is controlled as described above. The amount of oxygen plasma introduced at the time of vapor deposition is preferably selected to be in a range of from 1 sccm to 100 sccm, especially in a range of from 5 sccm to 50 sccm in terms of the amount of introduced oxygen gas. If the oxygen introduction period is too short or the amount of introduced oxygen plasma is too small, it is difficult to obtain a required metal thin film. On the other hand, if the oxygen introduction period is too long or the amount of introduced oxygen plasma is too large, it is impossible to obtain good characteristic because a large amount of oxygen is mixed with the metal thin film.

The substrate temperature at the time of forming the metal thin film 4 by a vapor deposition method is selected to be preferably in a range of from 300° C. to 800° C., more preferably in a range of from 500° C. to 600° C. If the substrate temperature is too low, the metal thin film of good crystallinity cannot be obtained or adhesion between the metal thin film and the buffer layer is worsened. On the other hand, if the substrate temperature is too high, surface flatness of the metal thin film is worsened or pinholes are produced.

The deposition rate of the metal thin film is selected to be preferably in a range of from 0.01 nm/s to 1 nm/s, more preferably in a range of from 0.02 nm/s to 0.1 nm/s. If the deposition rate is too low, there arises a problem that the metal thin film is apt to be contaminated with residual gas or the like or throughput at the time of production is lowered because a long time is required for forming the metal thin film. On the other hand, if the deposition rate is too high, the crystallinity of the metal thin film is worsened or the crystal grain size becomes too small.

EXAMPLES

The invention will be described below more in detail on the basis of the following specific examples of the invention.

Example 1

An Si(100) substrate 2 having a thickness of 250 $\mu$m and a resistivity of 1000 Ω·cm and made of Si single crystal cut and mirror-polished to have a (100) plane as a surface was prepared. The surface of the Si(100) substrate 2 was etched/cleaned with an aqueous solution of 40% ammonium fluoride. A buffer layer 3 of $ZrO_2$, a metal thin film 4 of Pt and a wurtzite type thin film 5 of AlN were formed on the substrate 2 by the following procedure to obtain an electronic device substrate structure sample.

Figure 6:
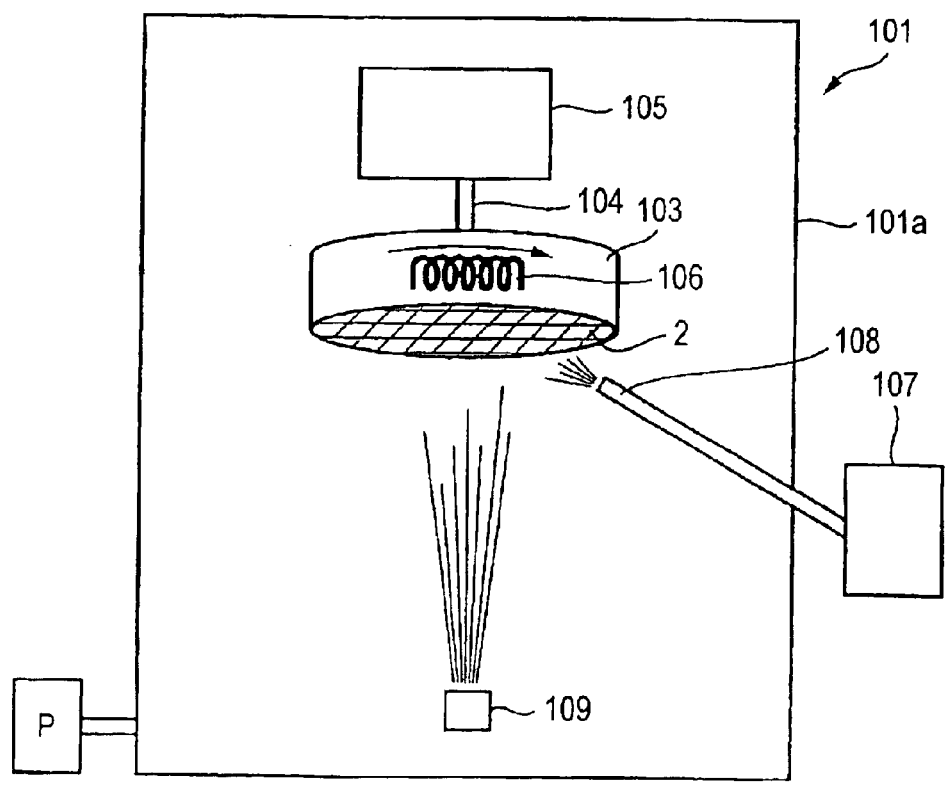
FIG. 6 is a view showing an example of an evaporation system used for production of an electronic device substrate structure according to the invention.

First, an evaporation system 101 shown in FIG. 6 was used. The substrate 2 was fixed to a substrate holder 103 which was installed in a vacuum chamber 101a of the evaporation system 101 and which had a rotating mechanism based on a rotary shaft 104 and a motor 105, and a heating mechanism based on a heater 106. The vacuum chamber was evacuated to $6 \times 10^{-4}$ Pa by an oil diffusion pump. Then, in order to produce Si oxide for protecting the cleaned surface of the substrate 2, the substrate 2 was rotated at 20 rpm and heated to 600° C. while 25 cc/min of oxygen was introduced into the neighborhood of the substrate 2 from an oxidizing gas supply nozzle 108 of an oxidizing gas supply unit 107. As a result, thermal oxidation occurred, so that an Si oxide layer about 1 nm thick was formed in the substrate surface.

Then, the substrate 2 was heated to 900° C. and rotated at 20 rpm and metallic Zr vaporized from a Zr vaporization portion 109 was supplied to the surface of the substrate 2 while 25 cc/min of oxygen gas was introduced from the nozzle 108. As a result, both reduction of the Si oxide formed in the preceding step and formation of a buffer layer 3 were performed. The thickness of the buffer layer 3 was set at 10 nm.

Then, while the substrate 2 with the buffer layer 3 formed on its surface was heated to 600°° C. and rotated at 20 rpm, a 150 nm-thick metal thin film 4 was formed by a vapor deposition method. During vapor deposition, oxygen plasma was introduced at an oxygen gas flow rate of 10 sccm and at RF power of 100 W until the thickness of the metal thin film 4 reached 10 nm after the start of vapor deposition. Incidentally, the deposition rate of the metal thin film 4 was set at 0.06 nm/s.

Then, a 1.7 μm-thick wurtzite type thin film 5 was formed on the metal thin film 4 in an Ar+N$_2$ atmosphere by an RF magnetron sputtering method. Metallic Al was used as a target and the substrate temperature was set at 200° C.

Figure 7:
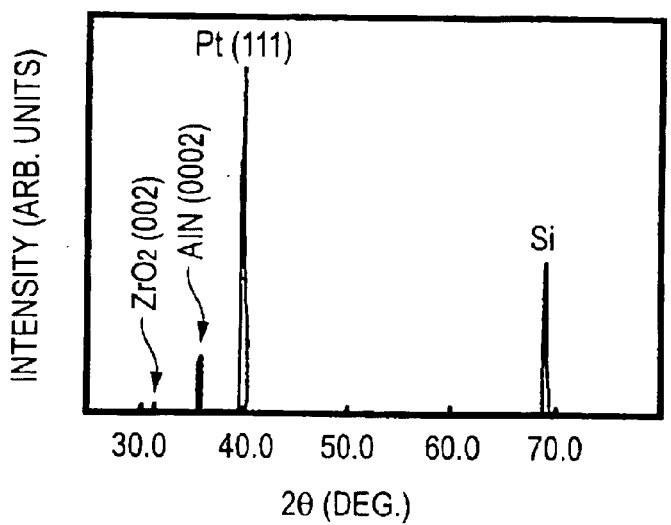
FIG. 7 is a diffraction graph showing a result of θ-2θ X-ray diffraction of an Si (100)/ZrO$_2$/Pt/AlN laminate structure produced in Example.

The crystallinity of each thin film in the obtained sample was evaluated by X-ray diffraction. FIG. 7 shows a result of θ-2θ X-ray diffraction of the sample. In FIG. 7, only diffraction lines corresponding to the plane spaces of respective AlN(0002), Pt(111) and ZrO$_2$(002) planes are observed except the diffraction line of Si derived from the substrate 2. It is obvious from this result that the buffer layer 3 is a simple ZrO$_2$(001)-oriented film, the metal thin film 4 is a simple Pt(111)-oriented film and the wurtzite type thin film 5 is a simple AlN (0001)-oriented film.

Figure 8:
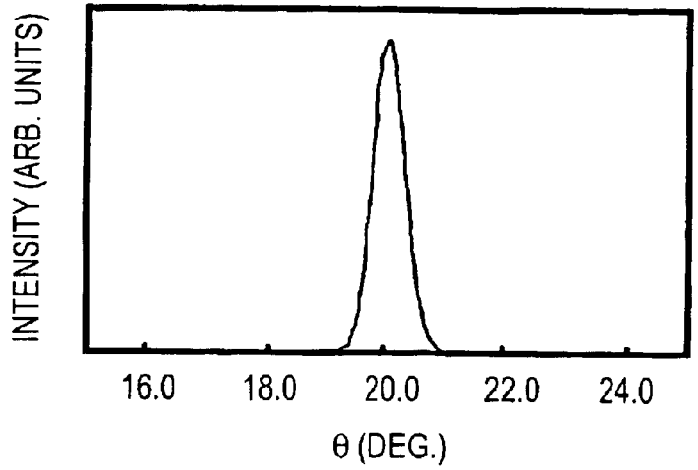
FIG. 8 is an X-ray rocking curve of Pt(111) in the Si(100)/ZrO$_2$/Pt/AlN laminate structure produced in Example.
Figure 9:
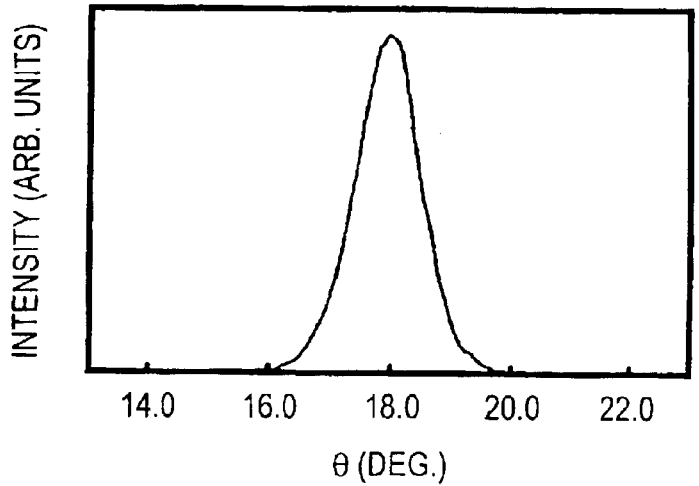
FIG. 9 is an X-ray rocking curve of AlN(0002) in the Si(100)/ZrO$_2$/Pt/AlN laminate structure produced in Example.

FIG. 8 shows an X-ray rocking curve of Pt(111). FIG. 9 shows an X-ray rocking curve of AlN(0002). The half-value width of the rocking curve in the metal thin film 4 of Pt is 0.62°. The half-value width of the rocking curve in the wurtzite type thin film 5 of AlN is 1.2°. It is obvious that the two thin films 4 and 5 are highly oriented films.

Figure 4:
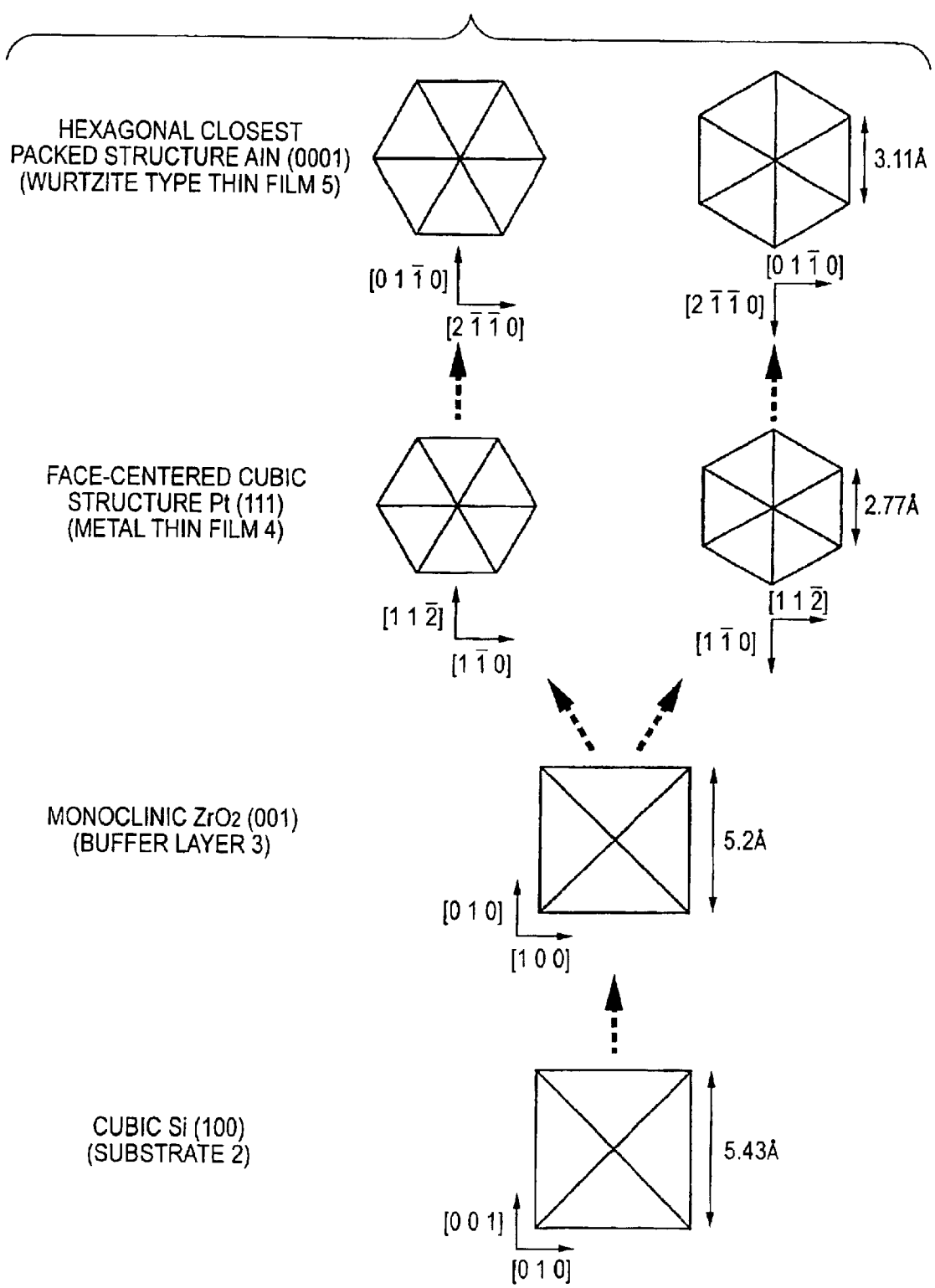
FIG. 4 is a typical view showing directions of crystal orientation in planes of a substrate and respective thin films formed on the substrate in an electronic device substrate structure according to the invention.
Figure 10:
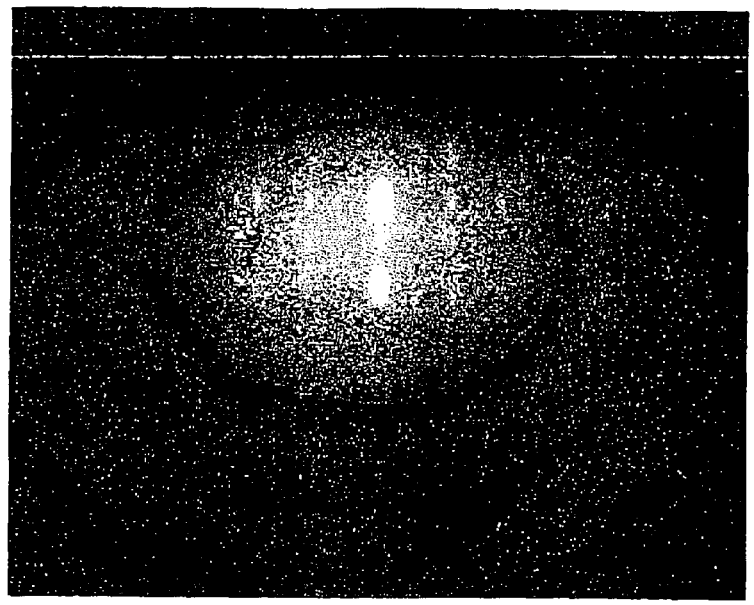
FIG. 10 is a drawing-substitute photograph showing a crystal structure, that is, showing an RHEED pattern of AlN(0001) in an Si(100)/ZrO$_2$(001)/Pt(111)/AlN(0001) laminate structure produced in Example in the case where the incident electron beam axis is parallel to the Si<010> direction.

After each thin film was formed at the time of production of the sample, evaluation using RHEED (Reflection High Energy Electron Diffraction) was performed. RHEED evaluation is an indicator of orientation of crystal axes in a film plane. FIG. 10 shows an RHEED pattern of the wurtzite type thin film 5 of AlN. The pattern shown in FIG. 10 is an overlap pattern which includes a pattern obtained when electron beams are incident upon the (0001) plane of the AlN single crystal from the <2-1-10> direction, and a pattern obtained when electron beams are incident upon the (0001) plane of the AlN single crystal from the <10-10> direction. The RHEED pattern shown in FIG. 10 was observed both in a direction equivalent to Si<010> of the Si(100) substrate 2 and in a direction rotated by 30° therefrom. As an RHEED pattern of the metal thin film 4 of Pt, an overlap pattern obtained when electron beams were incident upon the Pt (111) plane from the <1-10> and <11-2> directions was observed both in a direction equivalent to Si<010> and in a direction rotated by 30° therefrom. It is obvious from this result that directions of crystal orientation in the respective planes of the substrate and respective thin films in this sample are as shown in FIG. 4. The directions of crystal orientation in FIG. 4 are equivalent to those in FIG. 2.

Figure 11:
FIG. 11 is a drawing-substitute photograph showing a crystal structure, that is, showing a TEM image of Pt(111) in an Si(100)/ZrO$_2$(001)/Pt(111) laminate structure produced in Example in the case where Pt (111) is photographed from the top.

FIG. 11 shows a TEM image obtained by photographing the metal thin film 4 of the produced sample from the top. It is obvious from FIG. 11 that the metal thin film 4 is a polycrystalline film composed of crystal grains each having a grain size of about 200 nm.

Figure 12:
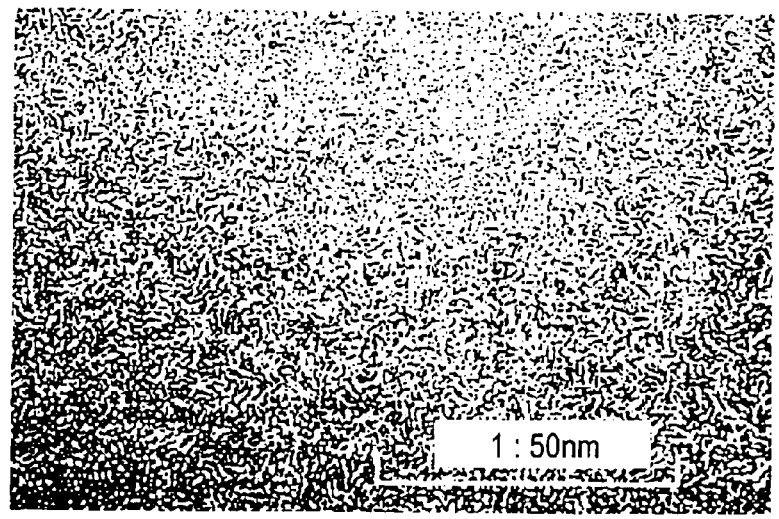
FIG. 12 is a drawing-substitute photograph showing a crystal structure, that is, showing an SEM image of AlN (0001) in the Si(100)/ZrO$_2$(001)/Pt(111)/AlN(0001) laminate structure produced in Example in the case where AlN(0001) is photographed from the top.
Figure 13:
FIG. 13 is a drawing-substitute photograph showing a crystal structure, that is, showing a TEM image of AlN (0001) in the Si(100)/ZrO$_2$(001)/Pt(111)/AlN(0001) laminate structure produced in Example in the case where AlN(0001) is photographed from the top.

FIG. 12 shows an SEM image obtained by photographing the wurtzite type thin film 5 from the top after the formation of the wurtzite type thin film 5. In FIG. 12, granular convex portions each having a diameter of the order of tens of nanometers are observed in the surface of the film. Gaps between adjacent convex portions are depressed like grooves. It is obvious from FIG. 12 that the wurtzite type thin film 5 is a polycrystalline film composed of crystal grains each having a grain size of the order of tens of nanometers in the plane. FIG. 13 shows a TEM image obtained by photographing the wurtzite type thin film 5 from the top after the formation of the wurtzite type thin film 5. In FIG. 13, a pattern of arranged hexagons each having a diameter of from about 10 nm to about 20 nm is observed. It is obvious from this result and the SEM image shown in FIG. 12 that the wurtzite type thin film 5 is composed of crystal grains each having a grain size of from about 10 nm to about 20 nm.

The mean crystal grain size $d_M$ of the metal thin film 4 and the mean crystal grain size $d_W$ of the wurtzite type thin film 5 were obtained by the aforementioned procedure, and the ratio $d_M/d_W$ was calculated as follows.

$d_M$=194 nm, $d_W$=10.6 nm, and $d_M/d_W$=18.3

Incidentally, a moire pattern zone is observed in the lower right corner of the TEM image of the wurtzite type thin film 5 shown in FIG. 13. The directions of lattices shift by 30° from each other with this zone as a boundary. It is conceived that this zone is equivalent to the boundary of Pt crystal grains as the undercoat and that the in-plane direction of Pt crystal as the undercoat shifts by 30° across this zone. AlN crystal grains are epitaxially grown on Pt crystal grains larger than the AlN crystal grains. Accordingly, all AlN crystal grains that are present on one Pt crystal grain are grown so that in-plane directions of the AlN crystal grains nearly coincide with one another.

In FIG. 13, lattice distortions or defects are observed between crystal grains which are adjacent to each other and which are the same in in-plane direction. It is conceived that these lattice distortions or defects are caused by distortion resulting from connection of adjacent crystal grains in a slightly shifting state of periodicity when respective AlN crystal grains are grown like pillars.

Example 2

A buffer layer 3, a metal thin film (lower electrode) 4 and a wurtzite type thin film (piezoelectric film) 5 were formed on a substrate 2 in the same manner as in Example 1. A second metal thin film (upper electrode) 6 of Al having a thickness of 300 nm was formed on the wurtzite type thin film 5 by a sputtering method to thereby produce a thin-film bulk vibrator. The substrate 2 was anisotropically etched with a KOH solution to form a via-hole.

Characteristic of the thin-film bulk vibrator was measured. As a result, good resonance characteristic was obtained as follows. That is, resonance frequency fr was 1.786 GHz, antiresonance frequency fa was 1.835 GHz, effective electromechanical coupling factor $(fa^2-fr^2)/fr^2$ was 5.5%, and the impedance difference between resonance and antiresonance was about 50 dB. The effective electromechanical coupling factor was close to 6% which was a value calculated on the basis of material constants of single crystal AlN.

Example 3

An Si(100) substrate 2 having a thickness of 250 μm and a resistivity of 500 Ω·cm and made of Si single crystal cut and mirror-polished to have a (100) plane as a surface was prepared. After the Si(100) substrate 2 was cleaned, 1.4 μm-thick AlN films and 0.8 μm-thick SiO$_2$ films were laminated alternately in this order on the Si(100) substrate 2 and a 50 nm-thick AlN film was further formed as a layer to thereby obtain a buffer layer 3 composed of nine film layers in total. Each film was formed by a sputtering method. It was confirmed by X-ray diffraction that each SiO$_2$ film in the buffer layer 3 was an amorphous film whereas each AlN film in the buffer layer 3 was a c face-oriented film. A 150 nm-thick metal thin film 4 of Pt and a 0.8 μm-thick wurtzite type thin film 5 of ZnO were formed on the buffer layer 3 to produce an electronic device substrate structure sample. The metal thin film 4 was formed at a substrate temperature of 600° C. and at a deposition rate of 0.6 nm/s by a vapor deposition method. The wurtzite type thin film 5 was formed in an Ar+$O_2$ atmosphere by an RF magnetron sputtering method using ZnO as a target without heating the substrate.

The crystal structure of this sample was analyzed by X-ray diffraction, RHEED and TEM. As a result, it was confirmed that the metal thin film 4 and the wurtzite type thin film 5 were a simple (111)-oriented polycrystalline film and a simple (0001)-oriented polycrystalline film respectively, and that <1-10> axes in the plane of the metal thin film 4 were parallel to <11-20> axes in the plane of the wurtzite type thin film 5. The half-value width of a rocking curve of ZnO(0002) in the wurtize type thin film 5 was 2.5°, so that it was confirmed that the wurtize type thin film 5 was a highly crystalline film. The mean crystal grain sizes of the metal thin film 4 and the wurtzite type thin film 5 measured by TEM and SEM were as follows.

$d_M$=200 nm, $d_W$=19 nm, and $d_M/d_W$=10.5

Example 4

A buffer layer 3, a metal thin film (lower electrode) 4 and a wurtzite type thin film (piezoelectric film) 5 were formed on a substrate 2 in the same manner as in Example 3. A second metal thin film (upper electrode) 6 of Al having a thickness of 300 nm was formed on the wurtzite type thin film 5 by a sputtering method to thereby produce a thin-film bulk vibrator. In this structure, the buffer layer 3 which was a laminate of AlN films and $SiO_2$ films functioned as an acoustic reflection film. Accordingly, no via-hole was formed in this structure.

Characteristic of the thin-film bulk vibrator was measured. As a result, good resonance characteristic was obtained as follows. That is, resonance frequency fr was 2.0 GHz, antiresonance frequency fa was 2.06 GHz, effective electromechanical coupling factor ($fa^2-fr^2$)/$fr^2$ was 6.0%, and the impedance difference between resonance and antiresonance was about 50 dB. The effective electromechanical coupling factor was close to a value calculated on the basis of material constants of single crystal ZnO.

According to the invention, a wurtzite type compound can be epitaxially grown on a metal thin film as a polycrystalline film to thereby form a polycrystalline wurtzite type thin film of good crystallinity. Because the metal thin film can be used as an electrode layer or a reflecting layer in an electronic device, such an electrode layer or a reflecting layer can be incorporated in an electronic device according to the invention without lowering of characteristic of the electronic device.

What is claimed is:

1. An electronic device substrate structure comprising:
    a substrate at least having a surface made of Si(100) single crystal;
    a metal thin film having a face-centered cubic structure or a hexagonal closest packed structure and formed on said substrate, said metal thin film being selected from the group consisting of a (111)-oriented film of a face-centered cubic structure having a (111) plane oriented in parallel to said substrate surface, and a (0001)-oriented film of a hexagonal closest packed structure having a (0001) plane oriented in parallel to said substrate surface; and
    a wurtzite type thin film having a wurtzite crystal structure and formed on said metal thin film, said wurtzite type thin film is a (0001)-oriented film having a (0001) plane oriented in parallel to said substrate surface;
    wherein each of said metal thin film and said wurtzite type thin film is a polycrystalline film containing at least two kinds of crystal grains different in direction of crystal orientation in the plane;
    when said metal thin film is a (111)-oriented film, said wurtzite type thin film is epitaxially grown on said metal thin film so that <11-20> axes in the plane of said wurtzite type thin film are parallel to <1-10> axes in the plane of said metal thin film; and
    when said metal thin film is a (0001)-oriented film, said wurtzite type thin film is epitaxially grown on said metal thin film so that <11-20> axes in the plane of said wurtzite type thin film are parallel to <11-20> axes in the plane of said metal thin film.

2. An electronic device substrate structure according to claim 1, wherein said metal thin film contains two kinds of crystal grains different crystal orientation in the plane;
    when said metal thin film is a (111)-oriented film, respective <1-10> axes of said two kinds of crystal grains are perpendicular to each other; and
    when said metal thin film is a (0001)-oriented film, respective <11-20> axes of said two kinds of crystal grains are perpendicular to each other.

3. An electronic device substrate structure according to claim 2, further comprising a buffer layer interposed between said substrate and said metal thin film, wherein said buffer layer is epitaxially grown so that a (001) plane of said buffer layer is parallel to said substrate and that a <100> axis in the plane of said buffer layer is parallel to a <010> axis in an Si(100) single crystal plane of said substrate.

4. An electronic device substrate structure according to claim 3, wherein:
    when said metal thin film is a (111)-oriented film, a <1-10> axis in one of said two kinds of crystal grains contained in said metal thin film is parallel to the <100> axis in the plane of said buffer layer while a <1-10> axis in the other of said two kinds of crystal grains is parallel to the <010> axis in the plane of said buffer layer; and
    when said metal thin film is a (0001)-oriented film, a <11-20> axis in one of said two kinds of crystal grains contained in said metal thin film is parallel to the <100> axis in the plane of said buffer layer while a <11-20> axis in the other of said two kinds of crystal grains is parallel to the <010> axis in the plane of said buffer layer.

5. An electronic device substrate structure according to claim 4, wherein a <11-20> axis in one of said two kinds of crystal grains contained in said wurtzite type thin film is parallel to the <010> axis in the Si(100) single crystal plane of said substrate while a <11-20> axis in the other of said two kinds of crystal grains contained in said wurtzite type thin film is perpendicular to the <010> axis in the Si(1 00) single crystal plane of said substrate.

6. An electronic device substrate structure according to any one of claims 3 through 5, wherein said buffer layer contains zirconium oxide as a main component.

7. An electronic device substrate structure according to any one of claims 1–5, wherein said metal thin film is larger in mean crystal grain size than said wurtzite type thin film.

8. An electronic device substrate structure according to any one of claims 1–5, wherein said metal thin film contains, as a main component, at least one member selected from the group consisting of Pt, Au, Ir, Os, Re, Pd, Rh and Ru.

9. An electronic device substrate structure according to any one of claims 1–5, wherein said wurtzite type thin film is either an AlGaInN type thin film containing, as main components, N and at least one member selected from the group consisting of Al, Ga and In, or a ZnO type thin film containing zinc oxide as a main component.

10. An electronic device substrate structure according to any one of claims 1–5, wherein said metal thin film is provided so that a half-value width of a rocking curve of reflection in a (111) or (0002) plane in X-ray diffraction is not larger than 3°.

11. An electronic device comprising an electronic device substrate structure defined in any one of claims 1 through 5, and a second metal thin film formed on said wurtzite type thin film of said electronic device substrate structure, wherein said pair of said metal thin films between which said wurtzite type thin film is sandwiched serve as electrodes.

12. An electronic device according to claim 11, wherein said wuitzite type thin film has piezoelectric characteristic so that said electronic device serves as a thin-film bulk vibrator.

* * * * *